(12) United States Patent  (10) Patent No.: US 6,496,414 B2
Kasa et al.  (45) Date of Patent: Dec. 17, 2002

(54) NONVOLATILE SEMICONDUCTOR MEMORY

(75) Inventors: Yasushi Kasa, Kawasaki (JP); Kazunari Kido, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/043,114

(22) Filed: Jan. 14, 2002

(65) Prior Publication Data

US 2002/0154542 A1 Oct. 24, 2002

(30) Foreign Application Priority Data

Apr. 20, 2001 (JP) .......................................... 2001-123180

(51) Int. Cl.[7] .......................... G11C 16/04; G11C 7/00; G11C 8/00
(52) U.S. Cl. .............................. 365/185.11; 365/189.01; 365/230.01
(58) Field of Search ........................ 365/185.11, 189.01, 365/230.01

(56) References Cited

U.S. PATENT DOCUMENTS

| 5,448,518 A | | 9/1995 | Jinbo | |
| 5,646,898 A | * | 7/1997 | Manning | 365/189.11 |
| 6,118,717 A | * | 9/2000 | Brady | 365/207 |
| 6,396,733 B1 | * | 5/2002 | Lu et al. | 365/158 |

* cited by examiner

*Primary Examiner*—David Nelms
*Assistant Examiner*—Ly Duy Pham
(74) *Attorney, Agent, or Firm*—Arent Fox Kintner Plotkin & Kahn, PLLC

(57) ABSTRACT

The input/output nodes of memory cells connected in series are connected to bit lines. Two of the bit lines positioned on the outsides of four successive memory cells constitute each of a plurality of bit line pairs. The bit line pairs are connected to four data lines, respectively, via switches connected to the respective bit lines. A switching control circuit turns on adjacent five of the switches. A switching circuit connects the data lines connected to the input/output nodes by the turning-on of the switches to a supply node of a first voltage, a supply node of a second voltage, and first and second sense amplifiers, respectively. Thereby, data is read from two of the memory cells simultaneously. Thus, it is possible to read data from the two memory cells simultaneously by using the simple switching control circuit without increasing the chip size.

7 Claims, 11 Drawing Sheets

| reading memory cells \ CL | CL0 | CL1 | CL2 | CL3 | CL4 | CL5 | CL6 | CL7 |
|---|---|---|---|---|---|---|---|---|
| MC0, MC1 | (H) | (H) | (H) | (H) | L | L | L | (H) |
| MC1, MC2 | (H) | (H) | (H) | (H) | (H) | L | L | L |
| MC2, MC3 | L | (H) | (H) | (H) | (H) | (H) | L | L |
| MC3, MC4 | L | L | (H) | (H) | (H) | (H) | (H) | L |
| MC4, MC5 | L | L | L | (H) | (H) | (H) | (H) | (H) |
| MC5, MC6 | (H) | L | L | L | (H) | (H) | (H) | (H) |
| MC6, MC7 | (H) | (H) | L | L | L | (H) | (H) | (H) |
| MC7, MC8 | (H) | (H) | (H) | L | L | L | (H) | (H) | column decoder 18

Fig. 7

| CL \ reading memory cells | CL0 | CL1 | CL2 | CL3 | CL4 | CL5 | CL6 | CL7 |
|---|---|---|---|---|---|---|---|---|
| MC0、MC3 | H | H | H | H | H | L | L | L |
| MC1、MC4 | L | H | H | H | H | H | L | L |
| MC2、MC5 | L | L | H | H | H | H | H | L |
| MC3、MC6 | L | L | L | H | H | H | H | H |
| MC4、MC7 | H | L | L | L | H | H | H | H |
| MC5、MC8 | H | H | L | L | L | H | H | H |
| MC6、MC9 | H | H | H | L | L | L | H | H |
| MC7、MC10 | H | H | H | H | L | L | L | H |

Fig. 11

NONVOLATILE SEMICONDUCTOR MEMORY

BACKGROUND OF THE INVENTION

1. Field of the Invention

The present invention relates to a technology of read operation of a nonvolatile semiconductor memory.

2. Description of the Related Art

Nonvolatile semiconductor memories such as flash memories store data by injecting electrons into the insulators of memory cells for changing threshold voltage. Among the nonvolatile semiconductor memories of this type, ones referred to as virtual ground type have a plurality of nonvolatile memory cells that are connected in series in the direction of word lines. The input/output nodes of adjacent memory cells are connected to common bit lines. Then, the bit lines positioned both sides of a memory cell are connected to a sense amplifier and a voltage source for reading data from the memory cell.

U.S. Pat. No. 5,448,518 has disclosed a technique for reading data simultaneously from two memory cells connected to an identical word line in a nonvolatile semiconductor memory of virtual ground type. In the nonvolatile semiconductor memory of this publication, two column decoders and two selectors are arranged both sides of a memory cell array. The column decoders decode column addresses and activate column-selecting lines according to the decoding results. The selectors have a plurality of column switches connected to the column selecting lines. Then, in read operations, these column decoders and selectors are operated so that the bit lines positioned both sides of two memory cells are respectively connected to sense amplifiers and voltage sources for reading data from the two memory cells. Reading data from two memory cells simultaneously improves data reading rate.

However, in the nonvolatile semiconductor memory of virtual ground type described above, reading out of data from two memory cells simultaneously requires the two column decoders and two selectors. Accordingly, there has been a problem that the control circuit for performing the read operations grows in scale, with an increase in chip size. In particular, the column switches are circuits to be arranged in large numbers within the memory, being required for each of the bit lines. This has a large influence on chip size.

SUMMARY OF THE INVENTION

It is an object of the present invention to read data simultaneously from two memory cells in a nonvolatile semiconductor memory without increasing the chip size.

It is another object of the present invention to improve the data reading rate of a nonvolatile semiconductor memory without increasing the chip size.

According to one of the aspects of the nonvolatile semiconductor memory of the present invention, the nonvolatile semiconductor memory has a plurality of nonvolatile memory cells, a word line, a plurality of bit lines, a plurality of switches, four data lines, a first sense amplifier, a second sense amplifier, a switching control circuit, and a switching circuit. The memory cells are connected in series via input/output nodes. The control gates of the memory cells are connected to the word line. The input/output nodes of the memory cells are connected to the bit lines, respectively. Four bit line pairs each consists of two of the bit lines respectively positioned on the outsides of four successive memory cells among the memory cells. The bit line pairs are connected to the four data lines, respectively, via the switches connected to the respective bit lines.

The first sense amplifier and the second sense amplifier amplify data read out from two of the memory cells, respectively. The switching control circuit turns on the switches corresponding to five of the input/output nodes adjacent to each other in a read operation, the five including the input/output nodes of the two memory cells for the data to be read from simultaneously. The switching circuit respectively connects the first and second sense amplifiers to two of the data lines transmitting the data among the data lines connected to the input/output nodes by turning-on of the switches. The switching circuit connects supply nodes of a first voltage and a second voltage to the remaining two of the data lines, respectively.

In this semiconductor memory, the switching control circuit only has to turn on predetermined five switches to read data from two memory cells simultaneously. Therefore, it is possible to read data from two memory cells simultaneously by using the simple switching control circuit without increasing the chip size of the nonvolatile semiconductor memory. In other words, the data reading rate can be improved without increasing the chip size.

According to another aspect of the nonvolatile semiconductor memory of the present invention, the two memory cells for the data to be read from (read memory cells) are adjacent to each other. The switching circuit, in the read operation, connects the first and second sense amplifiers to reading nodes among the input/output nodes, respectively. The reading nodes are on the outsides of the two memory cells. The switching circuit connects the supply node of the first voltage to first nodes among the input/output nodes. The first nodes are on the further outsides of the reading nodes. The switching circuit connects the supply node of the second voltage to a second node among the input/output nodes. The second node is between the two memory cells for the data to be read from.

At this point, the common second node is supplied with the second voltage, whereby memory cell currents occur depending on the memory states of the memory cells. The first and second sense amplifiers amplify the memory cell currents to read the data retained in the two memory cells, respectively. By supplying the first nodes with the first voltage, the difference between the voltages of the first node and the reading node on both sides of the memory cells arranged on the outsides of the read memory cells becomes nearly equal. Therefore, these memory cells can be prevented from causing a memory cell current. As a result, the memory cell currents of the memory cells to be read-operated can be all supplied to the first and second sense amplifiers for reliable data reading.

According to another aspect of the nonvolatile semiconductor memory of the present invention, the two memory cells for the data to be read from (read memory cells) are arranged on both sides of two of the memory cells adjacent to each other. The switching circuit, in the read operation, connects the first and second sense amplifiers to reading nodes among the input/output nodes, respectively. The reading nodes are on the insides of the two memory cells for the data to be read from. The switching circuit connects the supply node of the first voltage to first nodes among the input/output nodes. The first nodes are on the outsides of the two memory cells for the data to be read from. The switching circuit connects the supply node of the second voltage to a second node among the input/output nodes. The second node is on the inside of the reading nodes.

At this point, voltage differences between the first voltage and the voltages supplied from the first and second sense amplifiers to the reading nodes, respectively, cause memory cell currents depending on the memory states of the memory cells. The first and second sense amplifiers amplify the memory cell currents to read the data retained in the two memory cells, respectively. By supplying the innermost second node with the second voltage, the difference between the voltages of the reading node and the second node on both sides of the memory cells arranged on the insides of the read memory cells becomes nearly equal. This can prevent these memory cells from causing a memory cell current. As a result, the memory cell currents of the memory cells to be read-operated can be all supplied to the first and second sense amplifiers for reliable data reading.

According to another aspect of the nonvolatile semiconductor memory of the present invention, the nonvolatile semiconductor memory has a plurality of blocks each including eight of the memory cells, the four bit line pairs, eight of the switches, and the four data lines, and a selector. The selector selectively connects the switching circuit with data lines necessary for the read operation among the data lines of the blocks. Sectioning the plurality of memory cells into a plurality of blocks allows systematic operations of the switching control circuit and the switching circuit. As a result, the switching control circuit and the switching circuit can be configured simply, so that the chip size of the nonvolatile semiconductor memory can be reduced.

According to another aspect of the nonvolatile semiconductor memory of the present invention, the data is simultaneously read from two memory cells that are selected by different addresses and have an identical bit number of input/output data. By using successive addresses for the different addresses, address-decoding logic can be simplified. As a result, the switching control circuit can be configured simply, so that the chip size of the nonvolatile semiconductor memory can be reduced.

According to another aspect of the nonvolatile semiconductor memory of the present invention, the data is simultaneously read from two memory cells that are selected by an identical address and have different bit numbers of input/output data.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 7 is an explanatory diagram showing the operation of the column decoder of FIG. 2;

FIG. 11 is an explanatory diagram showing the operation of the column decoder of FIG. 8.

DESCRIPTION OF THE PREFERRED EMBODIMENTS

Hereinafter, embodiments of the present invention will be described with reference to the drawings.

Figure 1:
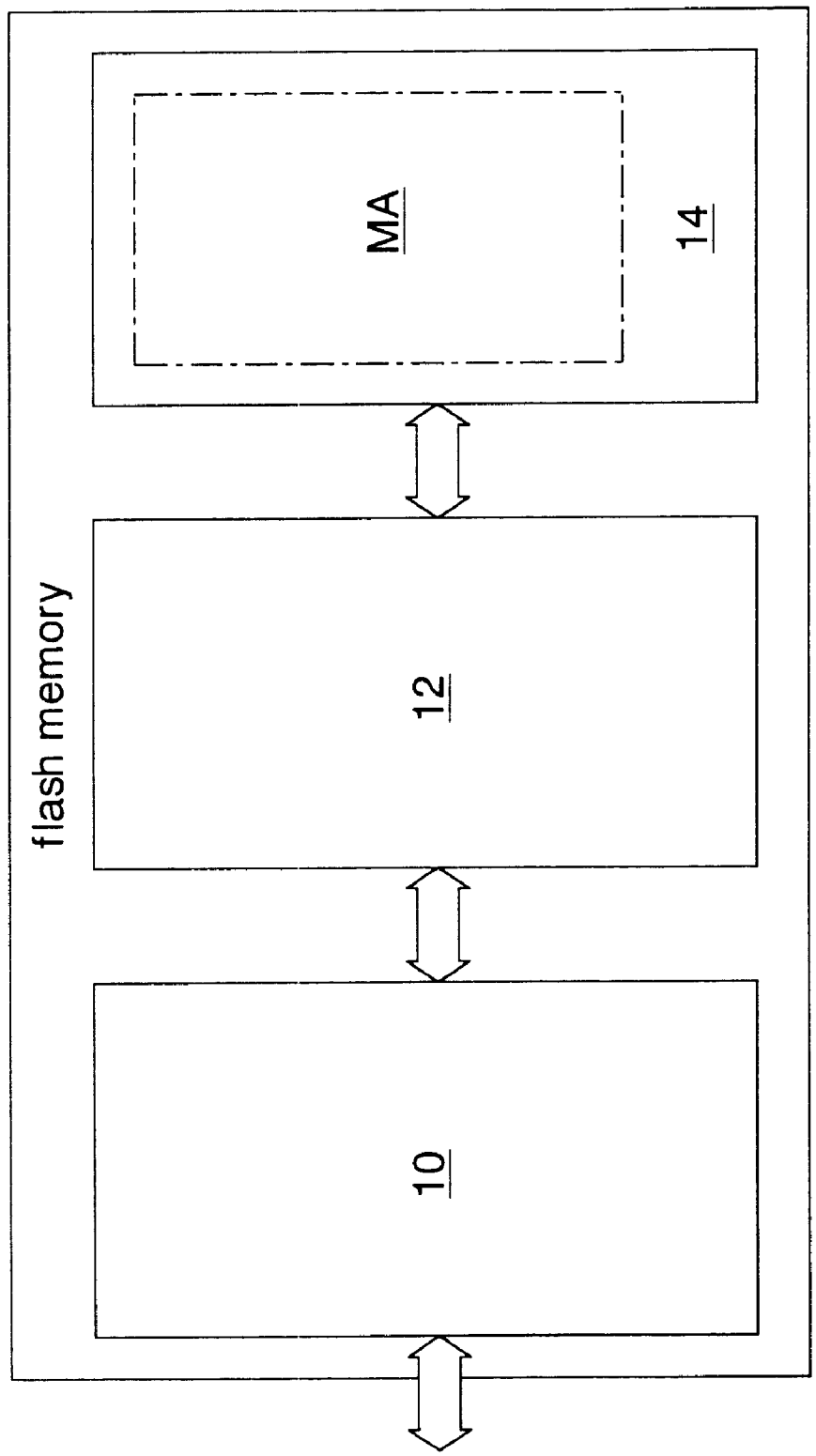
FIG. 1 is a block diagram showing a first embodiment of the present invention.

FIG. 1 shows a first embodiment of the nonvolatile semiconductor memory in the present invention. This nonvolatile semiconductor memory is formed as a flash memory on a silicon substrate by using CMOS processes.

The flash memory has an input/output unit 10 for inputting/outputting commands, addresses, data, and so on, a control unit 12 for controlling read operations, write operations (program operations), and erase operations, and a memory array unit 14 including a memory cell array MA and peripheral circuits thereof.

Figure 2:
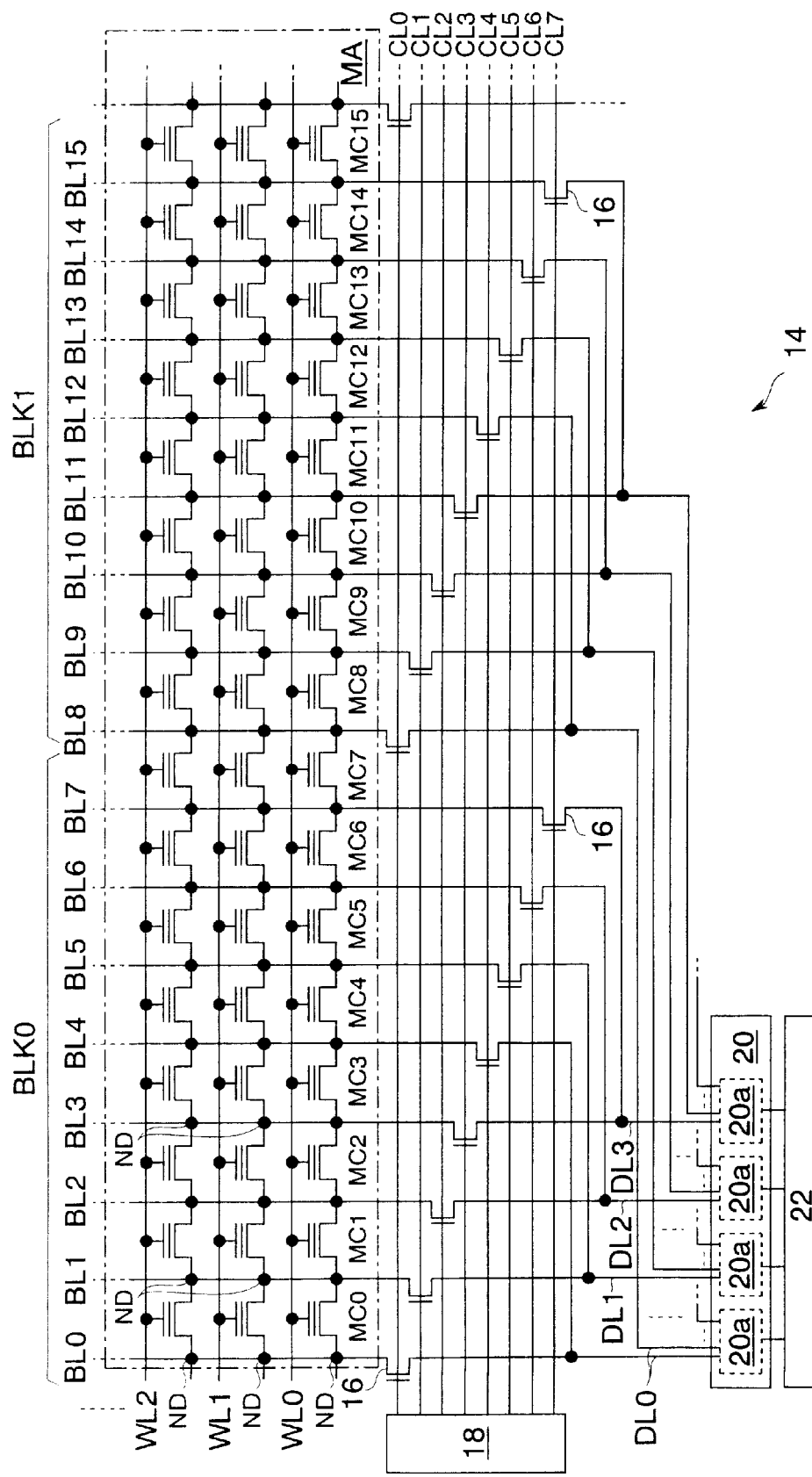
FIG. 2 is a block diagram showing the details of a memory core unit of FIG. 1.

FIG. 2 shows the details of the memory core unit 14. The memory core unit 14 includes the memory array MA, a plurality of column switches 16 each composed of an nMOS transistor, a column decoder 18, a selector 20, a switching circuit 22, a first sense amplifier 24, a second sense amplifier 26, a first voltage generator 28, and a second voltage generator 30.

The memory cell array MA has a plurality of nonvolatile memory cells MC (MC0, MC1, MC2, . . .) which are connected in series via input/output nodes ND. Each memory cell MC is formed by laminating a floating gate and a control gate. The control gates of the memory cells MC connected in series are connected to the same word lines WL (WL0, WL1, WL2, . . .). The word lines WL are selected by a not-shown row address. The input/output nodes ND of the memory cells MC in vertical direction in the diagram are connected to the same bit lines BL (BL0, BL1, BL2, . . .). The memory cell array MA above described generally referred to as virtual ground type is formed. Although not shown in particular, dummy memory cells and dummy bit line are arranged on the left of the bit line BL0 in the diagram.

Each of the column switches 16 is connected at one end to a bit line BL, at the other end to a data line DL (DL0, DL1, DL2, and DL3), and at its gate electrode to a column selecting line CL (CL0–CL7). Each data line DL is connected to two bit lines BL positioned outsides of four horizontally successive memory cells MC in the diagram via column switches 16. That is, the data lines DL0, DL1, DL2, and DL3 are connected to the bit line pairs BL0/BL4, BL1/BL5, BL2/BL6, and BL3/BL7, respectively, via two column switches 16.

Eight bit lines BL (four bit line pairs) connected to eight column switches 16, four data lines DL0–DL3, and the memory cells MC connected to the eight bit lines BL constitute each of blocks BLK (BLK0, BLK1, . . .) which are arranged in the wiring direction of the word lines WL. In this embodiment, eight memory cells MC connected to a word line in each block BLK are selected by respective different addresses. These different addresses are successive addresses. Memory cells MC in each horizontal direction in the diagram correspond to an identical bit number of input/output data. That is, the reading data read from these memory cells MC is output from a data input/output terminal through the input/output unit 10.

The column decoder 18 decodes a not-shown column address and activates the column selecting lines CL according to the decoding result. As will be described later, the column decoder 18 is characterized by activating five column selecting lines simultaneously in a read operation, turning on five switches 16 among the column switches 16 at a time. That is, the column decoder 18 functions as a switching control circuit for turning on predetermined five column switches 16.

The selector 20 has four selecting circuits 20a corresponding to the data lines DL0–DL3, respectively. Each selecting circuit 20a selects at least one from a plurality of data lines DL0 (DL1, DL2, or DL3) which belong to the blocks BLK0, BLK1, . . ., respectively, and connects the selected data line to the switching circuit 22.

The switching circuit 22 connects each of the data lines DL0–DL3 selected by the selector 20 to any of the first sense amplifier 24, the second sense amplifier 26, a supply node of a first voltage in the first voltage generator 28, and a supply node of a second voltage in the second voltage generator 30.

The first sense amplifier 24 and the second sense amplifier 26 compare memory cell currents that flow through memory cells MC according to the selection of a word line WL with a reference current, thereby detecting the logic levels of data retained in the memory cells. The first voltage generator 28 supplies the bit lines BL with the first voltage (low voltage; for example, 0 V to a little under 1 V). The first voltage is nearly equal to the bias voltage of the first and second sense amplifiers 24 and 26. The second voltage generator 30 supplies the bit lines BL with the second voltage (high voltage; for example, approximately 2 V).

Figure 3:
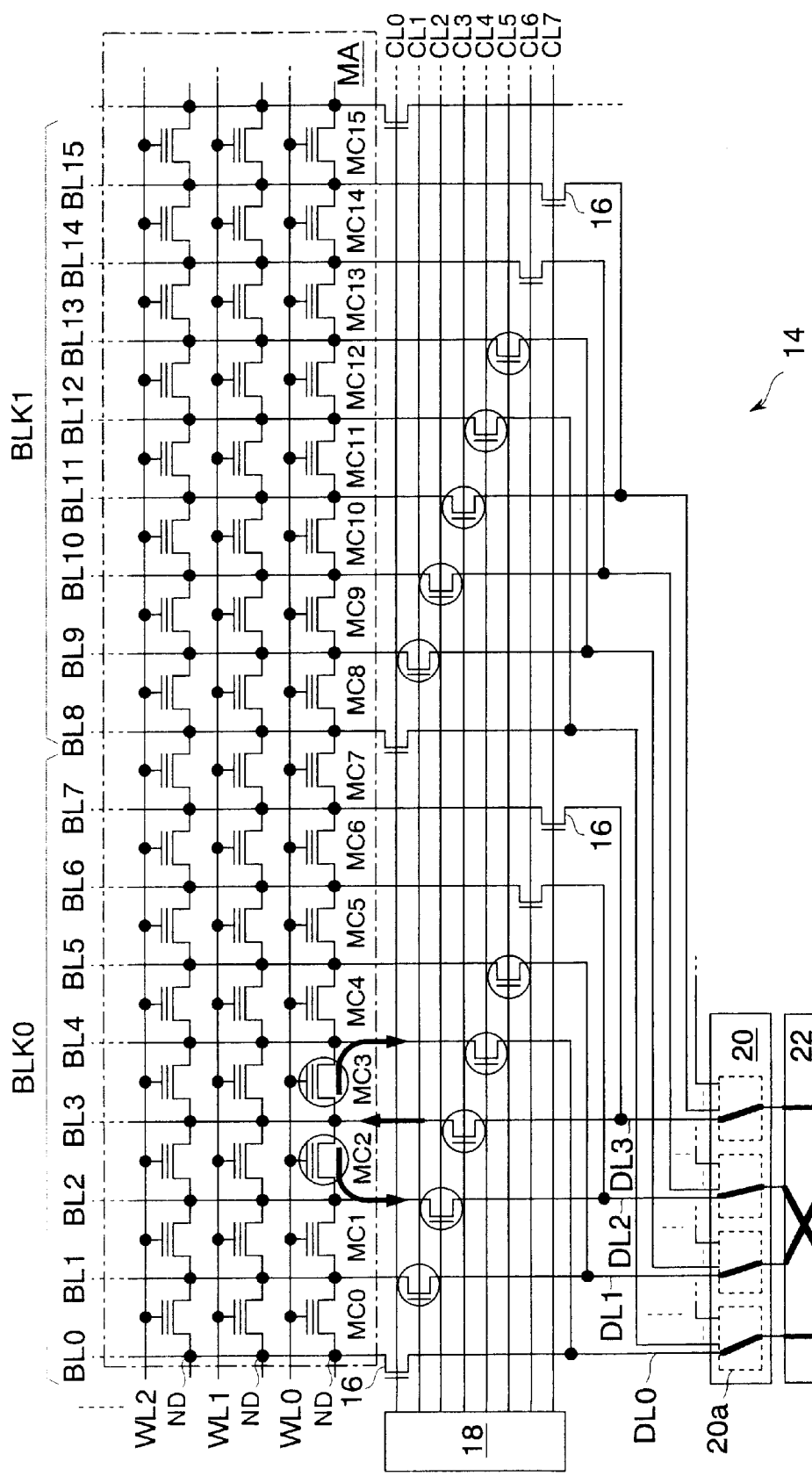
FIG. 3 is an explanatory diagram showing an example of a read operation in the memory core unit of FIG. 1.

FIG. 3 shows an example of a read operation in the nonvolatile semiconductor memory described above. In this example, data is read from the two-circled memory cells MC2 and MC3. The input/output nodes ND on the outsides of the memory cells MC2 and MC3 (corresponding to BL2 and BL4) function as reading nodes. The input/output nodes ND on the outsides of the reading nodes (corresponding to BL1 and BL5) function as the first nodes. The input/output node ND between the memory cells MC2 and MC3 (corresponding to BL3) functions as the second node.

Initially, the word line WL0 is activated according to a row address supplied from exterior of the memory. The column decoder 18 activates the five column selecting lines CL1–CL5 according to a column address supplied from exterior of the memory. The activation of the column selecting lines CL1–CL5 turns on the column switches 16 that are connected to the bit lines BL1–BL5. The selector 20 operates the selecting circuits 20a according to the column address so that the data lines DL0–DL3 of the block BLK0 are connected to the switching circuit 22. That is, the selector 20 connects the data lines DL0–DL3 of the block BLK0 performing a read operation to the switching circuit. The switching circuit 22 connects, according to the column address, the data lines DL0–DL3 to the first sense amplifier 24, the first voltage generator 28, the second sense amplifier 26, and the second voltage generator 30, respectively. Since the column switches 16 connected to the bit lines BL0, BL6, and BL7 are off, the bit lines BL0, BL6, and BL7 become floating (a state of being precharged with a low voltage).

The second voltage generator 30 supplies the high voltage (for example, approximately 2 V) to the input/output node ND between the memory cells MC2 and MC3 through the data line DL3 and the bit line BL3. Depending on the electrons stored in the floating gates of the memory cells MC2 and MC3 in advance, the memory cell MC2 and MC3 causes memory cell currents.

The first sense amplifier 24 detects the memory cell current of the memory cell MC3 through the bit line BL4 and the data line DL0, thereby reading the data retained in the memory cell MC3. The second sense amplifier 26 detects the memory cell current of the memory cell MC2 through the bit line BL2 and the data line DL2, thereby reading the data retained in the memory cell MC2.

The first voltage generator 28 supplies the low voltage (for example, 0 V to a little under 1 V) to the bit lines BL1 and BL5 through the data line DL1 and the two column switches 16. This low voltage reduces the voltage differences between the bit lines BL1/BL2, BL4/BL5 on both sides of the memory cells MC1 and MC4 (the source-to-drain voltage differences of the non-selected memory cells MC1 and MC4), whereby the memory cells MC1 and MC4 are prevented from causing a memory cell current. Therefore, the memory cell currents occurring in the memory cells MC2 and MC3 are all supplied to the second and first sense amplifiers 26 and 24.

In the block BLK1, the column switches 16 connected to the bit lines BL9–BL13 also turn on. Nevertheless, since the data lines DL0–DL3 of the block BLK1 are not connected by the selector 20, the bit lines BL9–BL13 become floating (being precharged with a low voltage). As a result, the read operation is performed on the memory cells MC2 and MC3 alone.

Figure 4:
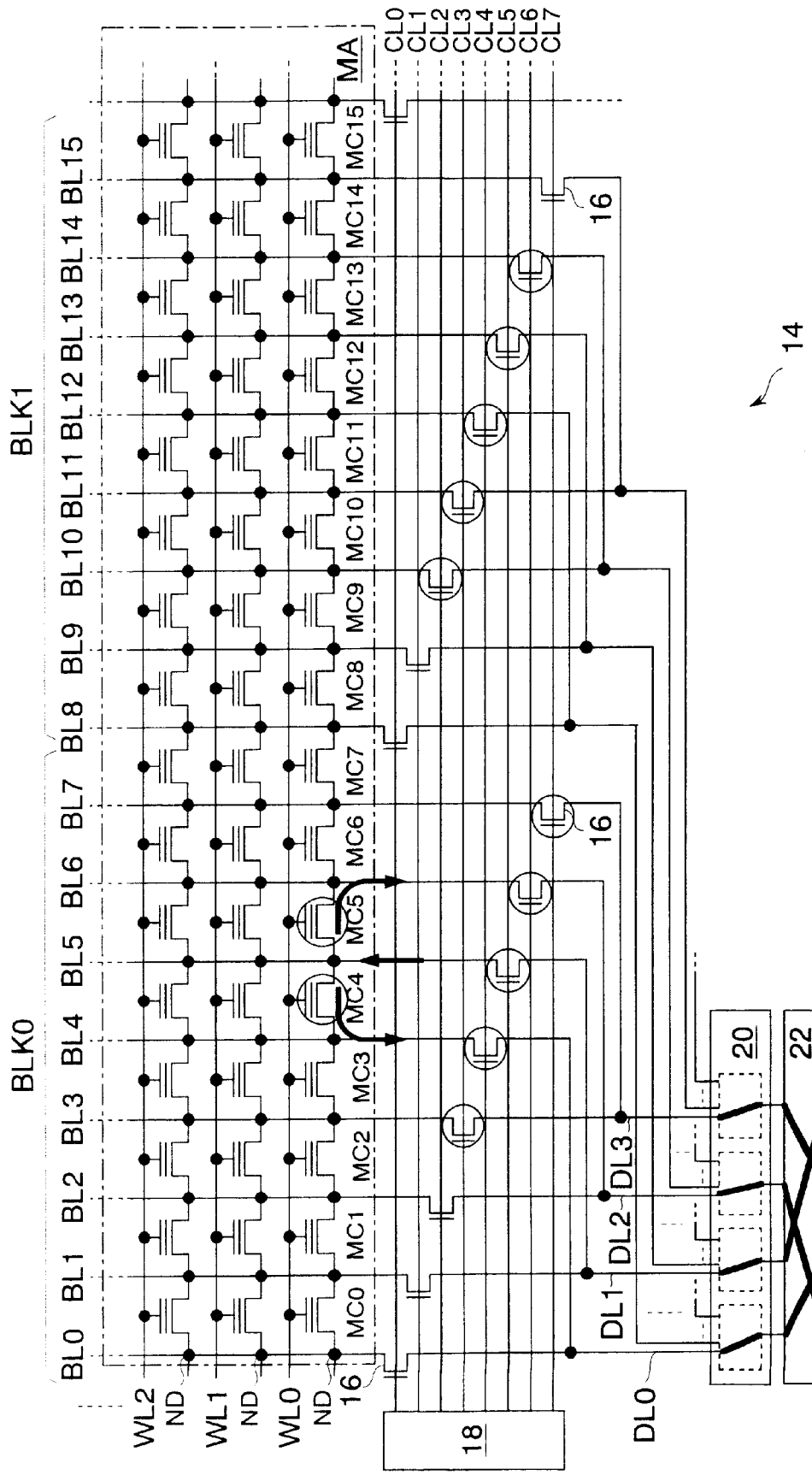
FIG. 4 is an explanatory diagram showing another example of the read operation in the memory core unit of FIG. 1.

FIG. 4 shows another example of the read operation in the nonvolatile semiconductor memory described above. In this example, data is read from the two-circled memory cells MC4 and MC5. Detailed description of operations similar to those of FIG. 3 will be omitted.

Initially, the word line WL0 is activated. The column decoder 18 activates the five column selecting lines CL2–CL6 according to the column address, turning on the column switches 16 that are connected to the bit lines BL2–BL6. The selector 20 connects the data lines DL0–DL3 of the block BLK0 to the switching circuit 22. The switching circuit 22 connects the data lines DL0–DL3 to the second sense amplifier 26, the second voltage generator 30, the first sense amplifier 24, and the first voltage generator 28, respectively.

The second voltage generator 30 supplies the high voltage to the input/output node ND between the memory cells MC4 and MC5 through the data line DL1 and the bit line BL5. The first sense amplifier 24 detects the memory cell current of the memory cell MC5 through the bit line BL6 and the data line DL2, thereby reading the data retained in the memory cell MC5. The second sense amplifier 26 detects the memory cell current of the memory cell MC4 through the bit line BL4 and the data line DL0, thereby reading the data retained in the memory cell MC4. The first voltage generator 28 supplies the low voltage to the bit lines BL3 and BL7 through the data line DL3 and the two column switches 16.

Figure 5:
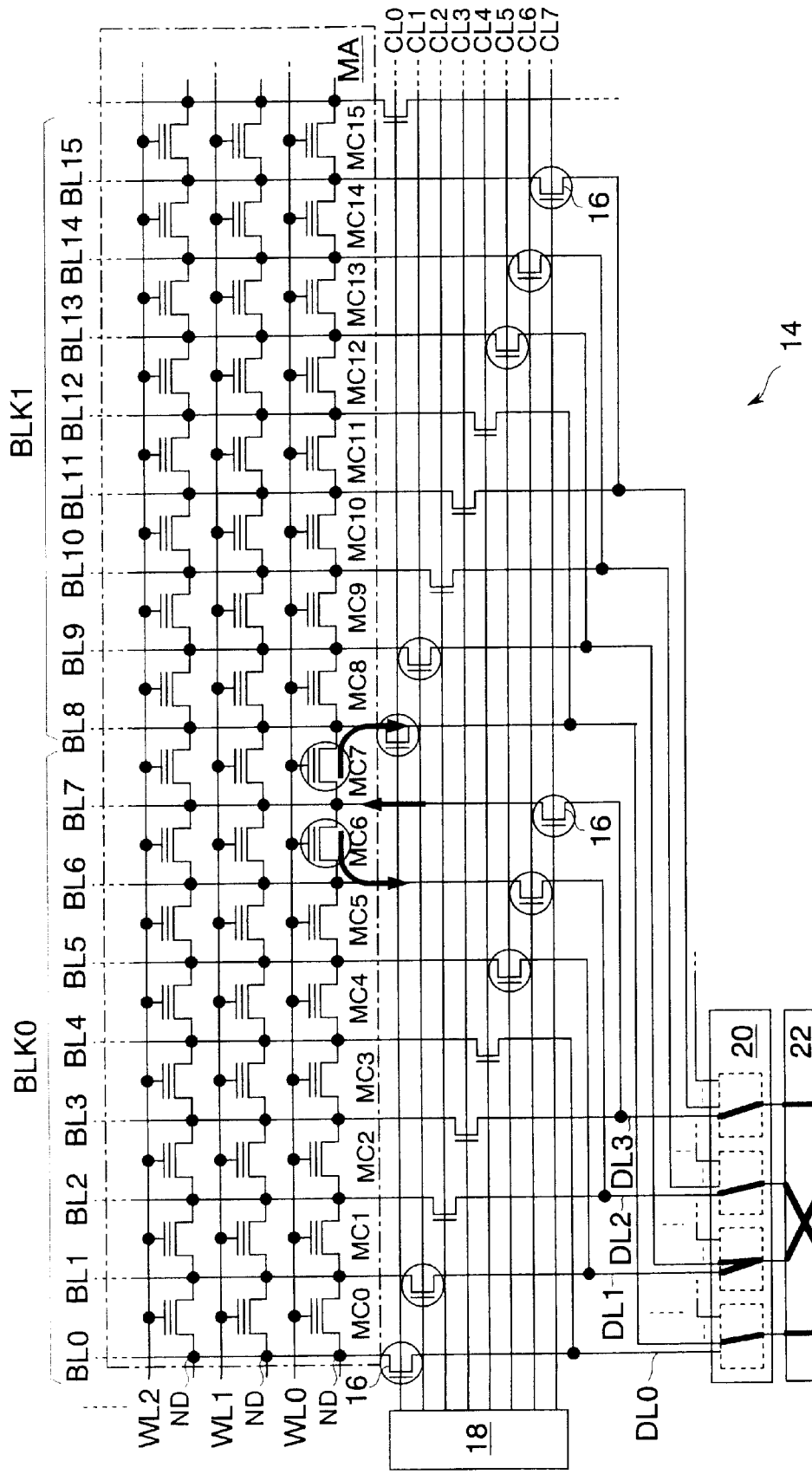
FIG. 5 is an explanatory diagram showing another example of the read operation in the memory core unit of FIG. 1.

FIG. 5 shows another example of the read operation in the nonvolatile semiconductor memory described above. In this example, data is read from the two-circled memory cells MC6 and MC7. Detailed description of operations similar to those of FIG. 3 will be omitted.

Initially, the word line WL0 is activated. The column decoder 18 activates the five column selecting lines CL5–CL7, CL0, and CL1 according to the column address, so that the column switches 16 connected to the bit lines BL5–BL9 are turned on. The selector 20 connects the data lines DL1–DL3 of the block BLK0 and the data lines DL0 and DL1 of the block BLK1 to the switching circuit 22. The switching circuit 22 connects the data line DL0 of the block BLK1 to the first sense amplifier 24, the data lines DL1 of the blocks BLK0 and BLK1 to the first voltage generator 28, the data line DL2 of the block BLK0 to the second sense amplifier 26, and the data line DL3 of the block BLK0 to the second voltage generator 30.

The second voltage generator 30 supplies the high voltage to the input/output node between the memory cells MC6 and MC7 through the data line DL3 and the bit line BL7. The first sense amplifier 24 detects the memory cell current of the memory cell MC7 through the bit line BL8 and the data line DL0 of the block BLK1, thereby reading the data retained in the memory cell MC7. The second sense amplifier 26 detects the memory cell current of the memory cell MC6 through the bit line BL6 and the data line DL2 of the block BLK0, thereby reading the data retained in the memory cell MC6. The voltage generator 28 supplies the low voltage to the bit lines BL5 and BL9 through the data line DL1 of the block BLK0 and the data line DL1 of the block BLK1.

Figure 6:
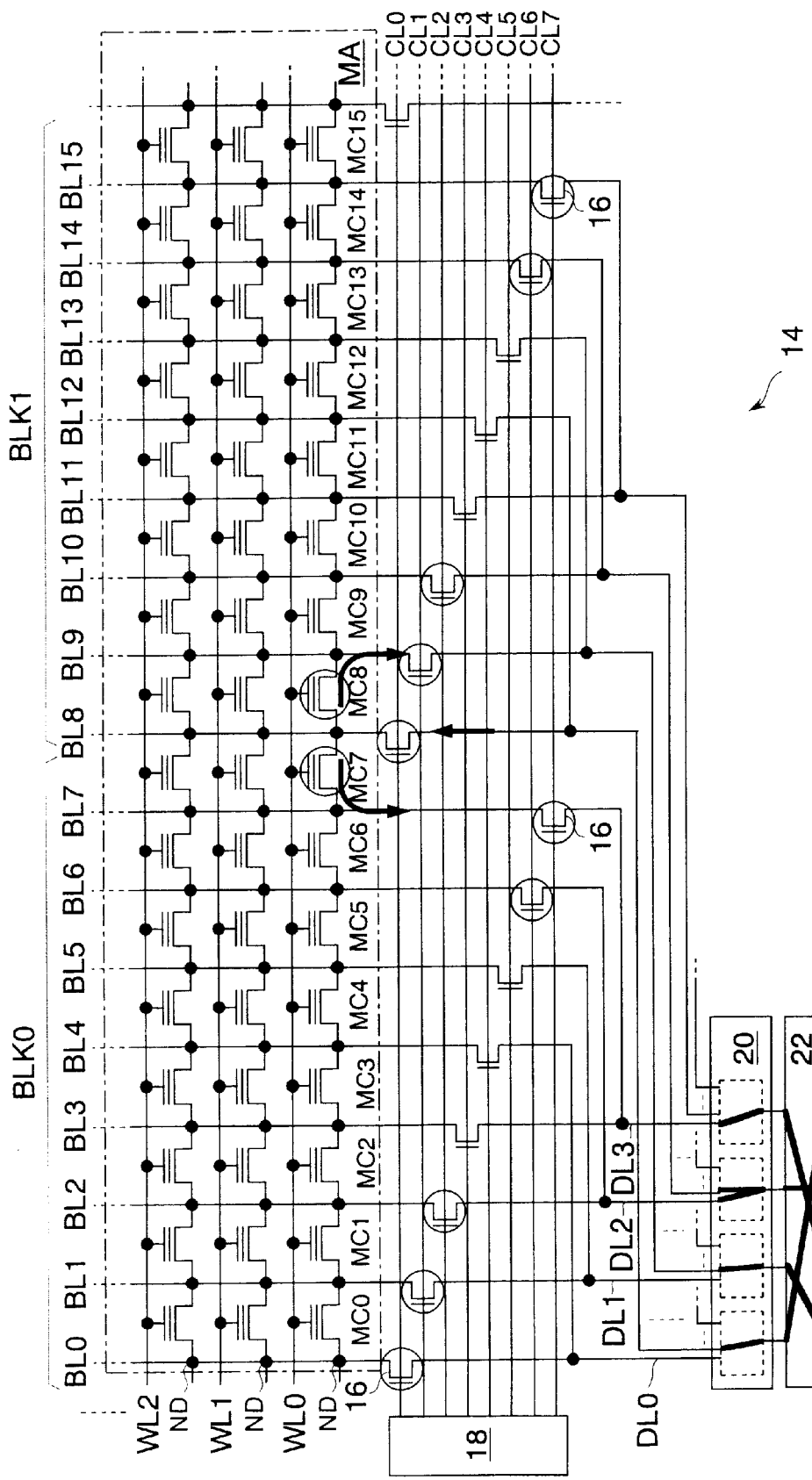
FIG. 6 is an explanatory diagram showing another example of the read operation in the memory core unit of FIG. 1.

FIG. 6 shows another example of the read operation in the nonvolatile semiconductor memory described above. In this example, data is read from the two-circled memory cells MC7 and MC8. Detailed description of operations similar to those of FIGS. 3 and 5 will be omitted.

Initially, the word line WL0 is activated. The column decoder 18 activates the five column selecting lines CL6, CL7, and CL0–CL2 according to the column address, so that the column switches 16 connected to the bit lines BL6–BL10 are turned on. The selector 20 connects the data lines DL2 and DL3 of the block BLK0 and the data lines DL0–DL2 of the block BLK1 to the switching circuit 22. The switching circuit 22 connects the data line DL0 of the block BLK1 to the second voltage generator 30, the data line DL1 of the block BLK1 to the first sense amplifier 24, the data lines DL2 of the blocks BLK0 and BLK1 to the first voltage generator 28, and the data line DL3 of the block BLK0 to the second sense amplifier 26.

The second voltage generator 30 supplies the high voltage to the input/output node between the memory cells MC7 and MC8 through the data line DL0 and the bit line BL8 of the block BLK1. The first sense amplifier 24 detects the memory cell current of the memory cell MC8 through the bit line BL9 and the data line DL1 of the block BLK1, thereby reading the data retained in the memory cell MC8. The second sense amplifier 26 detects the memory cell current of the memory cell MC7 through the bit line BL7 and the data line DL3 of the block BLK0, thereby reading the data retained in the memory cell MC7. The voltage generator 28 supplies the low voltage to the bit lines BL6 and BL10 through the data lines DL2 of the blocks BLK0 and BLK1.

FIG. 7 shows the operation of the column decoder 18. The column decoder 18 shown in FIG. 2 changes five column selecting lines CL to high level (the symbol "H" in the diagram) corresponding to data-reading memory cells MC, so that the column switches 16 connected to these column selecting lines CL are turned on. As shown in FIG. 7, the column decoder 18 simply activate the column selecting lines CL in orderly sequence corresponding to the data-reading memory cells MC. On this account, the column decoder 18 can be configured simply even in the case of reading data from two memory cells simultaneously.

As described, according to the present embodiment, the column decoder 18 only has to turn on predetermined five column switches 16 to read data simultaneously from two memory cells. Therefore, it is possible to read data simultaneously from two memory cells MC by using the simple column decoder 18 without increasing the chip size. In otherwords, the data reading rate can be improved without increasing the chip size.

Among the bit lines BL to be connected by the column switches 16, the outermost ones are supplied with the first voltage (low voltage). This can make the voltage difference between the input/output nodes ND lying on both sides of the memory cells MC arranged on the outsides of the data-reading memory cells MC nearly equal. Therefore, these memory cells MC can be prevented from causing a memory cell current. As a result, the memory cell currents of the memory cells MC to be read-operated can be all supplied to the first and second sense amplifiers 24 and 26 for reliable data reading.

Since each of the blocks BLK0, BLK1, . . . is composed of eight memory cells MC, four bit line pairs, eight column switches 16, and four data lines DL0–DL3, the column decoder 18 and the switching circuit 22 can be operated systematically. Therefore, the column decoder 18 and the switching circuit 22 can be configured simply with reducing the chip size.

Figure 8:
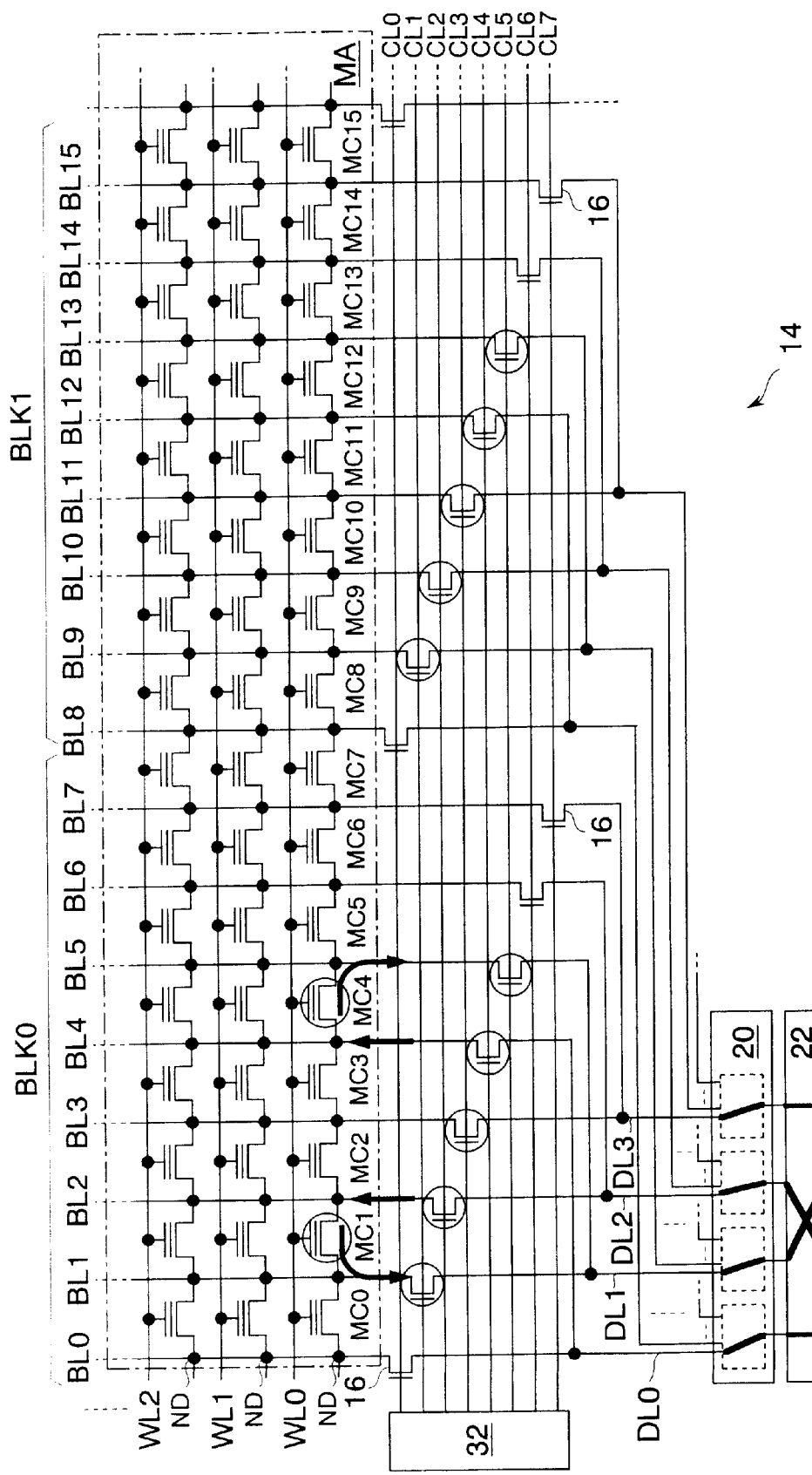
FIG. 8 is a block diagram showing the details of a memory core unit according to a second embodiment of the present invention.

FIG. 8 shows a second embodiment of the nonvolatile semiconductor memory in the present invention. The same circuits and signals as those described in the first embodiment will be designated by identical reference numbers or symbols. Detailed description thereof will be omitted here.

In this embodiment, a column decoder 32, and first and second sense amplifiers 34, 36 are formed instead of the column decoder 18, and the first and second sense amplifiers 24, 26 of the first embodiment. The other configuration is almost identical to that of the first embodiment. That is, each of the block BLK includes eight bit lines BL (four bit line pairs), eight column switches 16, four data lines DL0–DL3, and a plurality of memory cells MC connected to the eight bit lines BL. The data lines DL0–DL3 of the blocks BLK0, BLK1, . . . are connected to four selecting circuits 20a of the selector 20, respectively. Eight memory cells MC connected to a word line WL in each block BLK are selected by respective different addresses. These different addresses are successive addresses. Memory cells MC in each horizontal direction in the diagram correspond to an identical bit of input/output data, respectively.

Next, description will be given of a read operation of the nonvolatile semiconductor memory. In this example, data is simultaneously read from the two memory cells MC1 and MC4 which are arranged on both sides of two of the memory cells MC2 and MC3 adjacent to each other. The input/output nodes ND on the insides of the memory cells MC1 and MC4 (corresponding to BL2 and BL4) function as reading nodes. The input/output nodes ND on the outsides of the memory cells MC1 and MC4 (corresponding to BL1 and BL5) function as the first node. The input/output node ND on the inside of the reading nodes (corresponding to BL3) functions as the second node. Detailed description of operations similar to those of the foregoing first embodiment will be omitted.

Initially, the word line WL0 is activated. The column decoder 32 activates the five column selecting lines CL1–CL5 simultaneously according to the column address, so that the column switches 16 connected to the five bit lines BL1–BL5 are turned on. The selector 20 connects the data lines DL0–DL3 of the block BLK0 to the switching circuit 22 according to the column address. The switching circuit 22 connects, according to the column address, the data lines DL0–DL3 to the first sense amplifier 34, the first voltage generator 28, the second sense amplifier 36, and the second voltage generator 30, respectively.

The first sense amplifier 34 supplies a current to the bit line BL4 through the data line DL0. The sense amplifier 34 detects the current consumption (the memory cell current of the memory cell MC4), thereby reading the data retained in the memory cell MC4. The second sense amplifier 36 supplies a current to the bit line BL2 through the data line DL2. The sense amplifier 36 detects the current consumption (the memory cell current of the memory cell MC1), thereby reading the data retained in the memory cell MC1.

The first voltage generator 28 supplies a low voltage (for example, 0 V to a little under 1 V, or a ground voltage VSS) to the bit lines BL1 and BL5 through the data line DL1 and the two column switches 16. A voltage difference between the bit lines BL1 and BL2 causes the memory cell current of the memory cell MC1. A voltage difference between the bit lines BL4 and BL5 causes the memory cell current of the memory cell MC4.

The second voltage generator 30 supplies a high voltage to the bit line BL3 through the data line DL3. This high voltage is 1 V through 1.5 V higher than the low voltage for the first voltage generator 28 to generate, and nearly equal to the bias voltage of the first and second sense amplifiers 34 and 36. This high voltage reduces the voltage differences between the bit lines BL2/BL3 and BL3/BL4 on both sides of the memory cells MC2 and MC3 (the source-to-drain voltage differences of the non-selected memory cells MC2 and MC3), preventing the memory cells MC2 and MC3 from causing a memory cell current. Consequently, the currents supplied from the first and second sense amplifiers 34 and 36 are prevented from being consumed by memory cell currents occurring in the memory cells MC2 and MC3.

Figure 9:
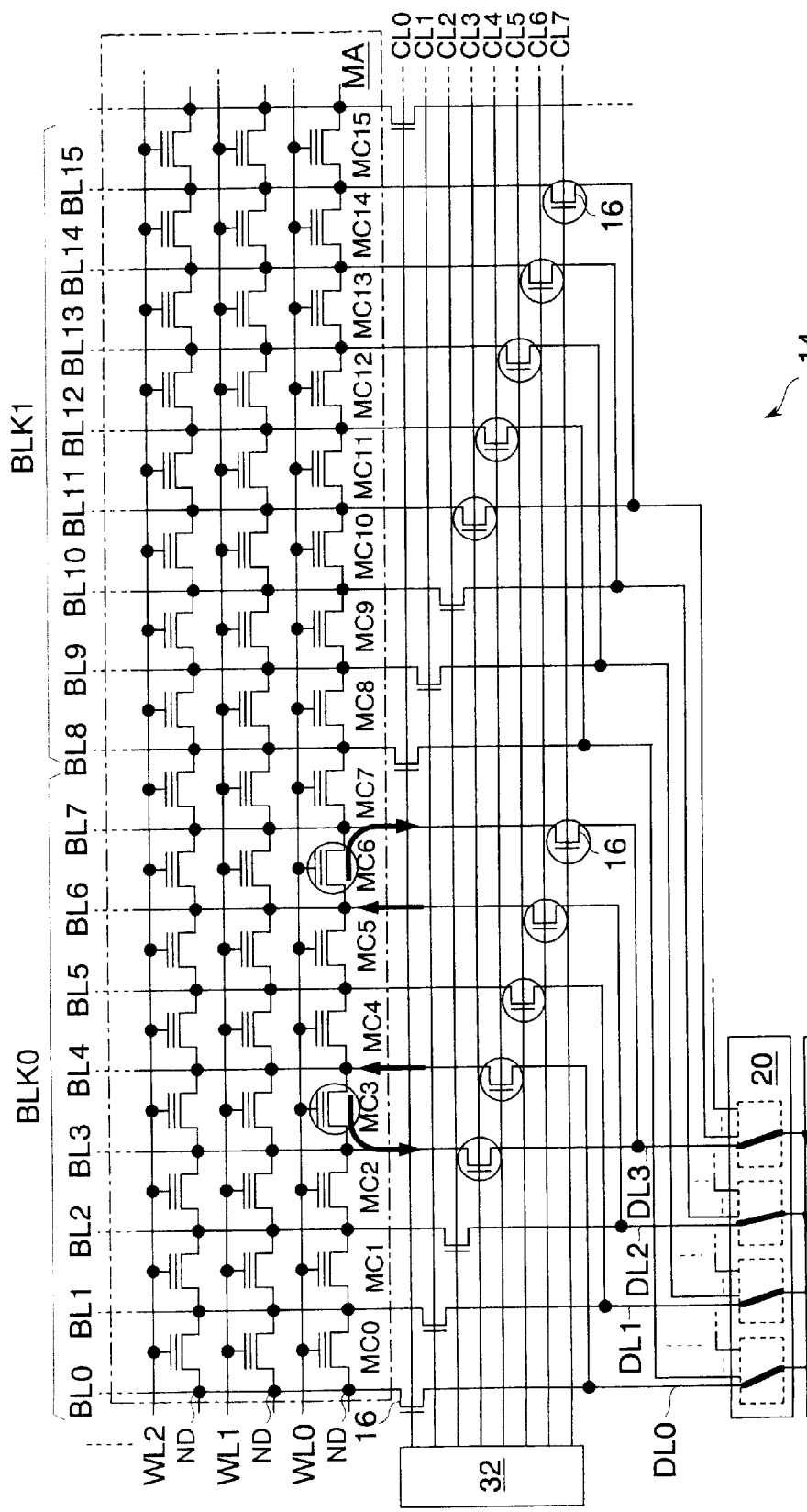
FIG. 9 is an explanatory diagram showing an example of a read operation in the memory core unit of FIG. 8.

FIG. 9 shows another example of the read operation in the nonvolatile semiconductor memory of the second embodiment. In this example, data is read from the two-circled memory cells MC3 and MC6. Detailed description of operations similar to those of FIG. 8 will be omitted.

Initially, the word line WL0 is activated. The column decoder 32 activates the five column selecting lines CL3–CL7, so that the column switches 16 connected to the bit lines BL3–BL7 are turned on. The selector 20 connects the data lines DL0–DL3 of the block BLK0 to the switching circuit 22 according to the column address. The switching circuit 22 connects, according to the column address, the data lines DL0–DL3 to the second sense amplifier 36, the second voltage generator 30, the first sense amplifier 34, and the first voltage generator 28, respectively.

The first sense amplifier 34 supplies a current to the bit line BL6 through the data line DL2 to read the data retained in the memory cell MC6. The second sense amplifier 36 supplies a current to the bit line BL4 through the data line DL0 to read the data retained in the memory cell MC3.

The first voltage generator 28 supplies the low voltage to the bit lines BL3 and BL7 through the data line DL3 and the two column switches 16, thereby making the memory cells MC3 and MC6 cause memory cell currents. The second voltage generator 30 supplies the high voltage to the bit line BL5 through the data line DL1.

Figure 10:
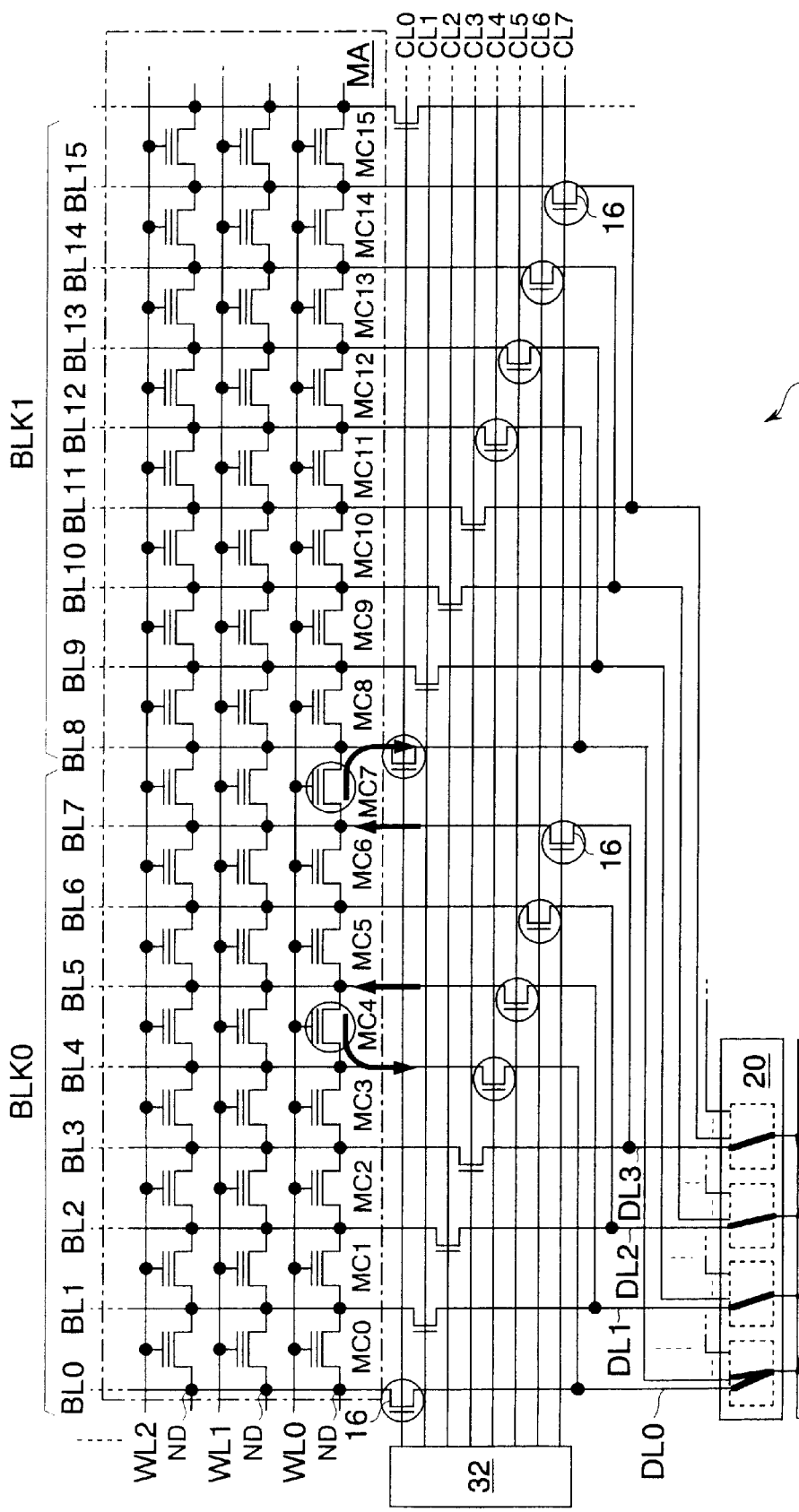
FIG. 10 is an explanatory diagram showing another example of the read operation in the memory core unit of FIG. 8.

FIG. 10 shows another example of the read operation in the nonvolatile semiconductor memory of the second embodiment. In this example, data is read from the two-circled memory cells MC4 and MC7. Detailed description of operations similar to those of FIG. 8 will be omitted.

Initially, the word line WL0 is activated. The column decoder 32 activates the five column selecting lines CL4–CL7 and CL0, so that the column switches 16 connected to the bit lines BL4–BL8 are turned on. The selector 20 connects the data lines DL0–DL3 of the block BLK0 and the data line DL0 of the block BLK1 to the switching circuit 22. The switching circuit 22 connects the data lines DL0 of the blocks BLK0 and BLK1 to the first voltage generator 28, the data line DL1 of the block BLK0 to the second sense amplifier 36, the data line DL2 of the block BLK0 to the second voltage generator 30, and the data line DL3 of the block BLK0 to the first sense amplifier 34.

The first sense amplifier 34 supplies a current to the bit line BL7 through the data line DL3 to read the data retained in the memory cell MC7. The second sense amplifier 36 supplies a current to the bit line BL5 through the data line DL1 to read the data retained in the memory cell MC4.

The first voltage generator 28 supplies the low voltage to the bit lines BL4 and BL8 through the data lines DL0 of the blocks BLK0 and BLK1, thereby making the memory cells MC4 and MC7 cause memory cell currents. The second voltage generator 30 supplies the high voltage to the bit line BL6 through the data line DL2.

FIG. 11 shows the operation of the column decoder 32 in the second embodiment. The column decoder 32 changes five column selecting lines CL corresponding to data-reading memory cells MC to high level (the symbol "H" in the diagram), so that the column switches 16 connected to these column selecting lines CL are turned on. As shown in FIG. 11, the column decoder 32 has only to activate the column selecting lines CL corresponding to the data-reading memory cells MC in orderly sequence. Therefore, as in the first embodiment, the column decoder 32 can be configured simply even in the case of reading data from two memory cells simultaneously.

This embodiment can offer the same effects as those obtained from the first embodiment described above.

The foregoing embodiments have dealt with the cases where two memory cells to read data from simultaneously are selected by different addresses while the bit numbers of the input/output data are identical. However, the present invention is not limited to such embodiments. For example, the two memory cells may be selected by an identical address and have different bit numbers of input/output data.

The foregoing embodiments have dealt with the cases where the present invention is applied to a flash memory having nonvolatile memory cells MC that are formed by laminating a control gate and a floating gate. However, the present invention is not limited to such embodiments. For example, the present invention may be applied to a flash memory having nonvolatile memory cells that are formed by laminating a control gate and a trap gate.

The foregoing embodiments have dealt with the cases where the present invention is applied to a flash memory. However, the present invention is not limited to such embodiments. The present invention may be applied to electrically-rewritable nonvolatile semiconductor memories of virtual ground type.

The invention is not limited to the above embodiments and various modifications may be made without departing from the spirit and scope of the invention. Any improvement may be made in part or all of the components.

What is claimed is:

1. A nonvolatile semiconductor memory comprising:
   a plurality of nonvolatile memory cells connected in series via input/output nodes;

a word line connected to control gates of said memory cells;

a plurality of bit lines connected to said input/output nodes, respectively;

a plurality of switches connected to said bit lines, respectively;

four bit line pairs each consisting of two of said bit lines respectively positioned on the outsides of four successive memory cells among said memory cells;

four data lines Connected to said bit line pairs via said switches, respectively;

a switching control circuit for turning on said switches corresponding to five of said input/output nodes adjacent to each other in a read operation, said five of said input/output nodes including said input/output nodes of two of said memory cells for data to be read from simultaneously;

a first sense amplifier and a second sense amplifier for amplifying said data read out from said two memory cells respectively; and a switching circuit for respectively connecting said first and second sense amplifiers to two of said data lines, and for connecting supply nodes of a first voltage and a second voltage to the remaining two of said data lines, respectively.

2. The nonvolatile semiconductor memory according to claim 1, wherein:

said two memory cells for said data to be read from are adjacent to each other; and said switching circuit, in said read operation, connects said first and second sense amplifiers to reading nodes among said input/output nodes, respectively, said reading nodes being on the outsides of said two memory cells, connects said supply node of said first voltage to first nodes among said input/output nodes, said first nodes being on the further outsides of said reading nodes, and connects said supply node of said second voltage to a second node among said input/output nodes, said second node being between said two memory cells.

3. The nonvolatile semiconductor memory according to claim 1, wherein:

said two memory cells for said data to be read from are arranged on both sides of two of said memory cells adjacent to each other; and said switching circuit, in said read operation, connects said first and second sense amplifiers to reading nodes among said input/output nodes, respectively, said reading nodes being on the insides of said two memory cells for said data to be read from, connects said supply node of said first voltage to first nodes among said input/output nodes, said first nodes being on the outsides of said two memory cells for said data to be read from, and connects said supply node of said second voltage to a second node among said input/output nodes, said second node being on the inside of said reading nodes.

4. The nonvolatile semiconductor memory according to claim 1, comprising:

a plurality of blocks each including eight of said memory cells, said four bit line pairs, eight of said switches, and said four data lines; and a selector for connecting, to said switching circuit, said data lines of one of said blocks that performs said read operation.

5. The nonvolatile semiconductor memory according to claim 1, wherein said two memory cells for said data to be read from simultaneously are selected by different addresses and have an identical bit number of input/output data.

6. The nonvolatile semiconductor memory according to claim 5, wherein said addresses are successive addresses.

7. The nonvolatile semiconductor memory according to claim 1, wherein said two memory cells for said data to be read from simultaneously are selected by an identical address and have different bit numbers of input/output data.

* * * * *